(12) United States Patent
Michna et al.

(10) Patent No.: US 11,251,603 B2
(45) Date of Patent: Feb. 15, 2022

(54) POWER BACKPLANE WITH DISTRIBUTED HOTSPOT DETECTION GRID

(71) Applicant: Hewlett Packard Enterprise Development LP, Houston, TX (US)

(72) Inventors: Vincent W. Michna, Houston, TX (US); David G. Carpenter, Houston, TX (US); Patrick Raymond, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 331 days.

(21) Appl. No.: 16/190,769

(22) Filed: Nov. 14, 2018

(65) Prior Publication Data

US 2020/0153233 A1 May 14, 2020

(51) Int. Cl.
*H02H 5/04* (2006.01)
*H05K 1/02* (2006.01)
*H02H 1/00* (2006.01)

(52) U.S. Cl.
CPC .......... *H02H 5/042* (2013.01); *H02H 1/0007* (2013.01); *H05K 1/0201* (2013.01);
(Continued)

(58) Field of Classification Search
CPC ...... H02H 1/0007; H02H 1/0023; H02H 5/04; H02H 5/042; H02H 5/043; H05K 1/0201;
(Continued)

(56) References Cited

U.S. PATENT DOCUMENTS

| 8,373,959 B2 * | 2/2013 | Kuczynski ........... H05K 1/0201 361/103 |
| 9,734,303 B2 | 8/2017 | Cosgrove et al. |

(Continued)

FOREIGN PATENT DOCUMENTS

| CN | 206847803 | * | 1/2018 | ............... G01K 1/14 |
| GB | 2314699 | * | 1/1998 | ............... H02H 7/20 |
| GB | 2314700 | * | 1/1998 | ............... H02H 5/04 |

OTHER PUBLICATIONS

Matchboxmatt; "Can a Lack of Thermal Compound Prevent Your PC From Turning on?"; Jul. 27, 2007; 6 pages.

(Continued)

*Primary Examiner* — Matthew V Nguyen
(74) *Attorney, Agent, or Firm* — Sheppard Mullin Richter & Hampton LLP

(57) ABSTRACT

Systems and methods are provided for providing thermal protection to a power backplane printed circuit board. A distributed hotspot detection grid is included in the printed circuit board, the distributed hotspot detection grid comprising a plurality of passive temperature sensors spread across the printed circuit board to measure temperature increases. The plurality of passive temperature sensors are connected to a detection circuit for comparing signals from the passive temperature sensors to a reference signal. If the temperature increases on the PCB, electrical characteristics of at least one passive temperature sensor will change, resulting in a change of the input signal to the detection circuit. When the threshold is exceeded (indicating a potential short circuit or hotspot), the detection circuit outputs a shut down signal to the one or more power supplies connected to the of the backplane printed circuit board, to avoid catastrophic damage to the printed circuit board.

20 Claims, 5 Drawing Sheets

(52) U.S. Cl.
CPC .............. *H05K 2201/09227* (2013.01); *H05K 2201/10151* (2013.01)

(58) Field of Classification Search
CPC ....... H05K 1/0204; H05K 2201/09227; H05K 2201/10151; H05K 2201/10196
See application file for complete search history.

(56) References Cited

U.S. PATENT DOCUMENTS

| | | | |
|---|---|---|---|
| 2008/0267258 A1* | 10/2008 | Hokenmaier | G01K 7/425 374/166 |
| 2011/0210703 A1 | 9/2011 | Souza et al. | |
| 2016/0217088 A1 | 7/2016 | Veil et al. | |
| 2019/0379199 A1* | 12/2019 | Mueller | H02H 1/0092 |
| 2020/0106257 A1* | 4/2020 | Gupta | H02H 1/0007 |

OTHER PUBLICATIONS

Microchip; "Temperature Sensor Design Guide"; printed in Mar. 20, 2018; 18 pages; http://ww1.microchip.com/downloads/en/DeviceDoc/21895d.pdf.

* cited by examiner

POWER BACKPLANE WITH DISTRIBUTED HOTSPOT DETECTION GRID

BACKGROUND

Power is distributed within servers generally through the use of a power backplane. A conventional power backplane typically includes a printed circuit assembly (PCA) generally consisting of a printed circuit board (PCB) with electrical traces connecting one or more power supplies to a number of components and other loads requiring power. The power backplane typically also includes electrical connectors to interface power from one or more power supplies to the units connected to the backplane. In some applications, power interface boards may be included to allow interfaces to pluggable power supplies, headers, utility connectors and so on.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
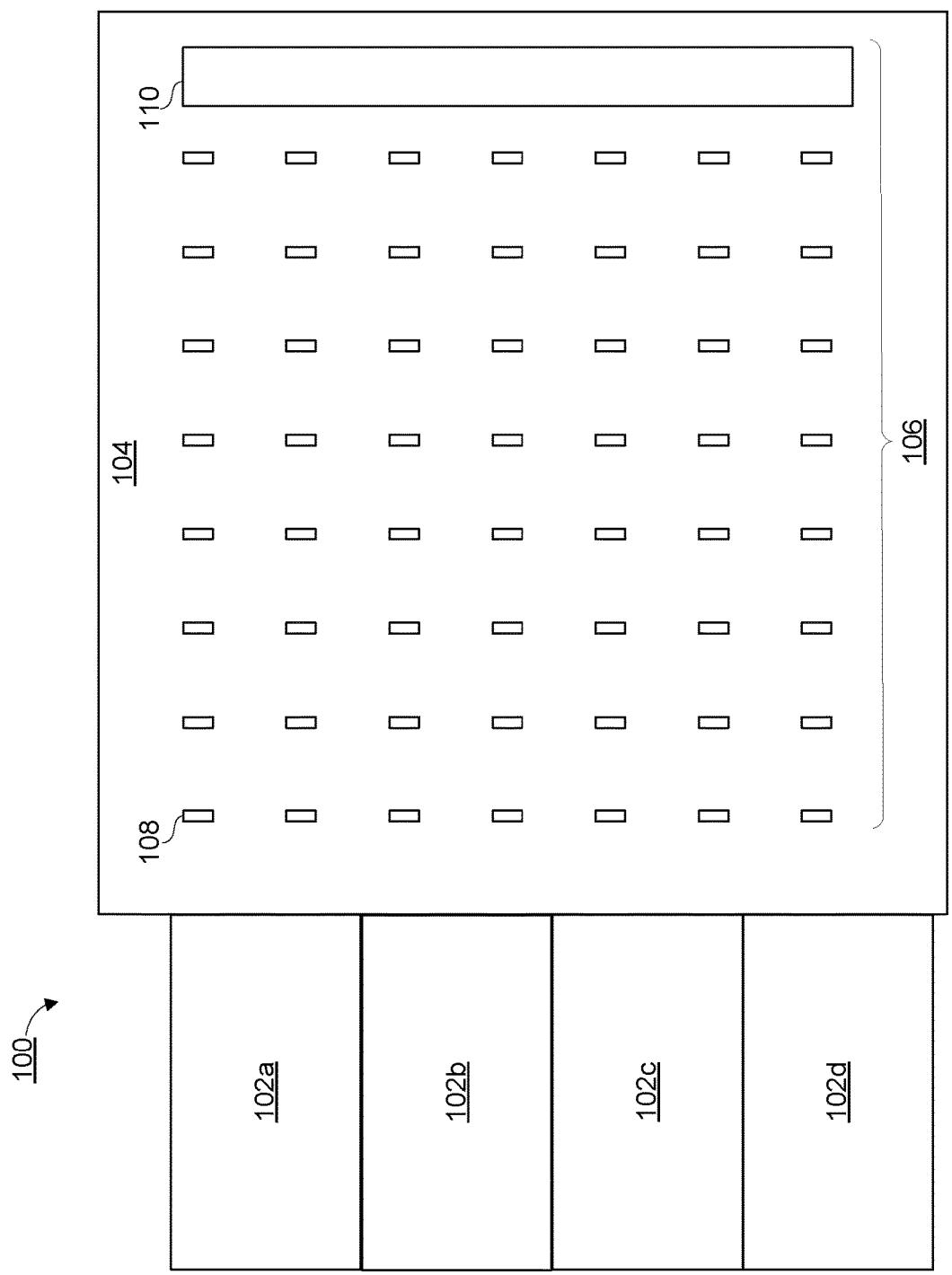
FIG. 1 illustrates an example power system with power supplies and a PCB including a distributed hotspot detection circuit in accordance with embodiments of the technology disclosed herein.

The figures are not exhaustive and do not limit the present disclosure to the precise form disclosed.

DETAILED DESCRIPTION

As processing speeds and complexity increase, servers are increasingly drawing more and more power. This increase has corresponded with a focus on increasing the density within servers, including more and more components and sub-assemblies within a smaller area. Multi-layered PCBs have helped to facilitate higher component density and design complexity by enabling a greater number of electrical traces to be available for use in distributing power to components. As the voltage to the server tends to remain constant, these two trends have led to more power needing to be dispersed over a smaller area, thereby resulting in higher and higher current levels within the power backplane.

The increased current levels within a smaller area raises the potential for catastrophic failure of the power backplane. Due to the increasing density, the spacing between conductive layers in the PCB of the power backplane has continued to decrease. This small separation requires near-perfect precision in manufacturing the power backplane to avoid physical defects in the PCB that may create short circuits. Moreover, the increased heat caused by the increased power being dissipated through the power backplane raises the potential impacts of electromigration (embodiments of the phenomenon in the PCB field known as copper migration). Slight discrepancies in the spacing between layers adds to the potential for copper migration to occur at a more rapid rate than anticipated, resulting in the board failure earlier than its expected life span.

With the increased current levels within the system, the potential for short circuits to develop on the power backplane, resulting in "hotspots," also increases. Although power supplies may have overcurrent protection (forcing a shut down when the current being pulled by the loads exceeds the power supplies' rating), the high-power requirements in high-density server designs makes it possible that a short circuit on the PCB of the power backplane may not trigger the overcurrent protection. For example, if there are 1000 amps of power available from the power supplies, the power supplies can feed a short circuit that is only pulling 600 amps without tripping the power supplies' overcurrent circuitry. In this example, that 600 amps would continue to go through the hotspot, generating a large amount of heat, potentially melting the board, causing damage and delamination.

Generally, these hotspots are relatively small compared to the size of the PCB of the power backplane (e.g., the PCB may be 18"×24", and the hotspot may be 0.5"×0.5"), making it difficult to effectively monitor and identify hotspots before damage occurs. Some servers may include active temperature sensing devices. Active temperature sensing devices (interchangeably, active temperature sensors) are generally external devices designed to monitor a component within a system, whether directly connected to the component or through some transmission medium. Active temperature sensing devices require their own power source and, traditionally, require a processing device to read signals and make a decision based on the readings. The active temperature sensors used in servers today tend to be designed to monitor the temperature of components that are known to get hot, such as ASICs, processors, hard drives, etc. The predictability with which such components may generate heat makes it easier to design an active temperature sensing device for effectively monitoring the components. For example, it is possible to identify specific areas of the components that may generate heat at dangerous levels during a problem situation. Or, as another example, the component itself may be expected to generate heat uniformly, allowing for a broad scope active temperature sensor to be designed to monitor whether the generated heat reaches a dangerous level.

However, the predictability of heat generation when a short circuit occurs on a PCB is much lower. First, manufacturers do not anticipate dangerous heat generation to occur in a properly manufactured PCB, so little to no attention is paid to how best to measure heat generation. Second, unlike the other components of a system discussed above, it is near impossible to know where a short circuit may appear on a PCB. When the short circuit is caused by damage during manufacture or installation, it is highly improbable that one can predict exactly where a short circuit may develop, acutely where the PCB comprises multiple layers (many not visible). Third, as discussed above, a hotspot could be miniscule relative to the size of the board. Therefore, designing an active temperature sensor that can effectively sense heat indicative of a potential hotspot before the heat reaches a dangerous level is highly complex and improbable. The sensitivity that would be required of an active temperature sensor to sense a small hotspot on the PCB board through a transmission medium (e.g., air) would not be functional within the system environment, where there are plenty of components that generate a certain amount of heat inherently. Moreover, because of the size and requirements of the components of an active temperature sensor, blanketing the PCB with a sufficient number of active temperature sensors would be impractical, as there would not be sufficient space within the already dense system enclosure.

Further, the potential damage caused by an undetected hotspot to the PCB itself could render the use of active temperature sensing devices ineffective. Active temperature sensing devices connected to the PCB and designed to detect a temperature value usually require a connection to a processor. The processor reads the data from the active temperature sensing device to determine whether the temperature is at or exceeding a certain threshold and to send an emergency shutoff signal to the power supplies if necessary. However, if the active temperature sensing device cannot effectively sense the entire area of the PCB, it may not be able to detect a hotspot before damage occurs. For example, the hotspot may be just outside the sensing area of the active temperature sensing device, and only after the heat has dispersed further from the actual hotspot would it be detected. At this point, the board may have already been damaged. This damage could impact the circuit connecting the active temperature sensing device to the processor, reducing the reliability or completely cutting off the sensing capability. The damage could also impact the connection between the processor and the power supplies, making it impossible for the processor to send the emergency shutoff signal to the processors, exacerbating the situation.

Embodiments of the present disclosure may be implemented to prevent catastrophic damage to the power backplane through effective detection of areas on the board that are getting too hot prior to damage occurring. A grid of passive temperature sensors are distributed across the PCB, providing a distributed hotspot detection circuit. Passive temperature sensors are generally electrical components whose electrical characteristics are reactive to temperature changes surrounding the component. Such components do not require an external power source for operation (e.g., can use the same control voltage Vcc of other components of a PCB), are small (usually having the form factor of a PCB component, like a resistor or a capacitor), and can be included directly on the PCB. In various embodiments, the passive temperature sensors may include negative temperature coefficient (NTC) thermistors, resistance temperature detectors (RTDs), positive temperature coefficient (PTD) thermistors, thermocouples, or other passive temperature sensors. By distributing a plurality of such passive temperature sensors, potential short circuits or hotspots may be detected before there is sufficient heat to cause damage to the PCB. Unlike active temperature sensors, passive temperature sensors do not require an external power source to operate, do not need to interface with a processor or microprocessor, and are less expensive. In various embodiments, the distributed hotspot detection grid includes a detection circuit connected to the plurality of passive temperature sensors. When a connected passive temperature sensor registers a temperature rise, its output voltage will change. This will result in the output of the detection circuit switching from one state to another, signaling the power supplies connected to the PCB to turn off.

FIG. 1 illustrates an example power system 100 with power supplies and a PCB including a distributed hotspot detection circuit in accordance with embodiments of the technology disclosed herein. For ease of discussion, the electrical traces between the components of the power backplane 100 have been omitted, but a person of ordinary skill in the art would understand how to design the electrical traces required in light of the present disclosure.

As illustrated, this example power system 100 includes a PCB 104 that interfaces to one or more power supplies 102a, 102b, 102c, 102d. Power from the power supplies 102a, 102b, 102c, 102d is disseminated via traces of PCB 104 to sub-assemblies and other component loads (not pictured) that may be connected to PCB 104. In various embodiments, the PCB 104 includes one or more interfaces to connect with each of the power supplies 102a, 102b, 102c, 102d. In some embodiments, removable connectors may be used such that one or more of the power supplies may be swapped out as needed. In other embodiments, one or more of the power supplies 102a, 102b, 102c, 102d may be hardwired to PCB 104 The PCB 104 also comprises a number of connectors for various sub-assemblies and components of a server. Electrical traces on the PCB 104 enable the components to draw power from, and thereby place a load on, the one or more power supplies.

The power PCB 104 also includes a distributed hotspot detection circuit 106 (interchangeably referred to as "a distributed hotspot detection grid" in the present disclosure). The distributed hotspot detection circuit 106 may include a plurality of passive temperature sensors 108 dispersed across the PCB 104, and a detection circuit 110 to detect over temperature conditions based on a voltage (or in some embodiments a current) presented to the detection circuit 110 by passive temperature sensors 108.

In various embodiments, the quantity of passive temperature sensors 108 included may vary depending on factors such as, for example, the sensitivity of the passive temperature sensors 108 to changes in temperature, and the resolution with which over-temperature conditions are desired to be detected. For example, for PCBs with a denser routing of traces, it may be desirable to place passive temperature sensors 108 more closely together to better identify the specific traces that may be causing the over-temperature condition. Less dense routing on the PCB may allow greater spacing (or density) of temperature sensors 108 while still achieving the ability to identify the traces responsible for the over-temperature condition. Device sensitivity may also play a role in determining the density with which temperature sensors 108 are positioned on PCB 104. Devices with greater sensitivity may be able to react to over-temperature conditions at a distance farther away from the device then when those devices with lesser sensitivity. However, using a more sensitive device to cover a larger area may result in a sacrifice of resolution and therefore the inability to pinpoint the specific traces responsible for an over-temperature condition.

In some embodiments, passive temperature sensors 108 may be implemented using negative temperature coefficient or NTC thermistors. An NTC thermistor is a resister whose resistance has an inverse relationship to heat; as the temperature increases, resistance decreases. The sensitivity of the NTC thermistor can be large, enabling large changes in resistance in response to small changes in temperature. The higher the resistance of an NTC thermistor, the larger the temperature coefficient. Other devices can be used as passive temperature sensors 108 in various embodiments to signal an increase in temperature such as, for example, resistance temperature detectors (RTDs), positive temperature coefficient (PTD) thermistors, thermocouples, or other passive temperature sensing devices. In various embodiments, the distributed hotspot detection circuit 106 may include one or more different types of passive temperature sensors.

In various embodiments, the number of passive temperature sensors 108 and their arrangement may be determined based on characteristics of the PCB 104. Non-limiting examples of characteristics of PCB 104 that may impact the number and arrangement of passive temperature sensors 108 include: number of conductive layers of the PCB 104; thickness of each conductive layer; spacing of dielectric or non-conductive layers between the conductive layers; surface area of the PCB 104 exposed to air; potential airflow across the PCB 104; density of components and sub-assemblies on the PCB 104; number of vias used to interconnect between layers; among other characteristics of the PCB 104. Based on the characteristics, a designer may determine an expected temperature drop off within a PCB 104 and determine the number and arrangement of passive temperature sensors 108 which would allow the distributed hotspot detection circuit 106 to cover the PCB 104 near completely. For example, based on a certain set of data, a designer may determine that the temperature drops off by 2° per inch as you move away from a hotspot, and that this can equate to a grid capable of sensing any hotspot temperature within ~5° with passive temperature sensors 108 with 4" spacing. Using this spacing, the designer can determine the number of passive temperature sensors 108 required.

As noted above, the power system 100 further includes a detection circuit 110 that can be used to detect an increase in temperature or an over-temperature condition using voltage or current levels provided to detection circuit 110 by temperature sensors 108. In some embodiments, detection circuit 110 may comprise a plurality of comparators electrically connected to passive temperature sensors 108, and connected to switch off an offending power supply when the voltage level provided by a connected passive temperature sensor 108 exceeds a threshold voltage. In various embodiments, where more than one type of passive temperature sensor 108 is included, each type of passive temperature sensor 108 may be connected to its own detection circuit 110. In such cases, multiple detection circuits 110 can be disposed on the PCB. In various embodiments, where more than one type of passive temperature sensor 108 is included, each type of passive temperature sensor 108 may be connected to a specific section of the same detection circuit 110.

As a more specific example, a plurality of NTC thermistors are implemented as passive temperature sensors 108 are connected with the detection circuit 110, comprising a plurality of comparators, through electrical traces on the PCB 104. A comparator circuit is a circuit designed to compare two signals and to output a signal based on the comparison. In various embodiments, the comparator circuits of detection circuit 110 can compare the voltage level from a passive temperature sensor 108 against a reference voltage. Each comparator circuit has a threshold voltage change which, when exceeded, causes the output of the comparator circuit to change (e.g., from HIGH to LOW, or from LOW to HIGH). The passive temperature sensors 108 and the detection circuit 110 may be tuned so that the detected temperature that will cause the detection hotspot detection circuit 106 to trip is higher than a designated high-end of a nominal operating temperature range (or in some implementations higher than the worst case operating temperature) of the power system 100, but lower than the temperature where damage may occur to the PCB 104, such as delamination, melting, etc.

In various embodiments, the detection circuit 110 may comprise a plurality of comparator circuits equal to the number of passive temperature sensors 108 within the distributed hotspot detection circuit 106. In such embodiments, each passive temperature sensor 108 would have its own corresponding comparator circuit (i.e., a 1-to-1 relationship). In other embodiments, one or more passive temperature sensors 108 may be connected in parallel to the same comparator circuit within the detection circuit 110. For example, a multiplexer or other like circuit can be used to accept multiple inputs from a plurality of passive temperature sensors 108 and provide them one at a time or simultaneously to the input of the corresponding comparator circuit. For example, in various embodiments the plurality of passive temperature sensors 108 may be partitioned into a plurality of subsets, each subset comprising one or more passive temperature sensors 108. Each subset can be associated with a different comparator circuit, with the passive temperature sensors 108 of each subset being connected to its associated comparator circuit in parallel. As each subset is associated with a different comparator circuit, each passive temperature sensor 108 is monitored by only one comparator circuit.

Where multiple comparator circuits are included within the detection circuit 110, the output of each comparator circuit is connected to the output of the detection circuit 110. Therefore, if any comparator circuit within the detection circuit 110 detects an overtemperature condition, the corresponding power supplies can be shut down. In still other embodiments, the detection circuit 110 may be a single comparator circuit to which all of the passive temperature sensors 108 are connected.

In various embodiments, the output signal of the detection circuit 110 may be connected to a "kill" switch of each of the power supplies 102a, 102b, 102c, 102d. For example, the output signal of the detection circuit 110 may be connected to an overcurrent protection circuit of each power supply 102a, 102b, 102c, 102d such that, when the output signal of the comparator component changes state, it triggers the overcurrent protection circuit of all the power supplies, or of the affected one or more power supplies. In other embodiments, the kill switch may be a latching device within the power supply 102a, 102b, 102c, 102d, such as a silicon-controlled rectifier (SCR) device, that is triggered by the change in output from the detection circuit 110. In such cases, the power supplies 102a, 102b, 102c, 102d will not be able to restart following a detected temperature event by the distributed hotspot detection grid 106 until the units are disconnected from input power (e.g., the input cable to the power supplies is disconnected). In various embodiments, the kill switch device may be included on the PCB 104, configured to shut down each of the power supplies 102a, 102b, 102c, 102d, while in other embodiments there may be multiple kill switch devices configured to send the shut down signal to one or more of the power supplies 102, 102b, 102c, 102d. In other embodiments, the kill switch device may be built into the power supplies 102a, 102b, 102c, 102d, and the detection circuit 110 may be connected to an interface of the power supplies to the kill switch device.

In various embodiments, the kill switch device used to shut down the power supplies 102a, 102b, 102c, 102d may be designed such that a baseline output of the detection circuit 110 is required to be sensed, otherwise the kill switch device will trigger. In this way, the distributed hotspot detection grid 106 can provide protection in the event the PCB 104 is damaged prior to detection by one or more of the temperature sensors 108. When damage to the board disrupts the connection between any of the NTC thermistors and the detection circuit 110, or between the detection circuit 110 and the kill switch device, the signal will change from the baseline, triggering the kill switch device to signal a shut down. In this way, the distributed hotspot detection grid 106 may minimize the damage sustained to the power system 100.

The output of the detection circuit 110 may be designed in some embodiments to not allow the power supplies 102a, 102b, 102c, 102d to power up in a first instance. The baseline signal of the detection circuit 110 (i.e., the state of the detection circuit 110 during normal operation) may be designed to be equal to the signal needed by the power supplies 102a, 102b, 102c, 102d to turn on. The detection circuit 110 output can be tied in with other operational signals necessary for the power supplies 102a, 102b, 102c, 102d to power on in the first instance. Power supplies generally include an auxiliary voltage output (separate from the main power output) that powers one or more operational signals necessary to turn on the main power output. In various embodiments, the operational signals may include an enable signal used to turn on the power supply and an internal "kill" signal for immediately shutting down the power supply. In some embodiments, the enable signal may be the signal indicating that the power supply has been properly connected. In some embodiments, the output of the detection circuit 110 may be tied into one or both of these signals. For example, in some embodiments, the output of the detection circuit 110 may be tied to the basic "kill" signal that is included within power supplies 102a, 102b, 102c, 102d. Unless the baseline output signal of the detection circuit 110 is present when the power supplies are connected, none will be able to power on. The signal may not be present at baseline due to damage already sustained by the PCB 104 or because of a fault within the distributed hotspot detection grid 106. By tying the output to the operational signal circuit of the power supplies, the power supplies will not turn on absent the baseline output of the comparator circuit. In this way, if the board does sustain damage and the connection between the distributed hotspot detection circuit and the power supplies is impacted, the power supplies will not turn on.

As illustrated in FIG. 1, in various embodiments the detection circuit 110 is disposed on the opposite end of the PCB 104 from the power supplies 102a, 102b, 102c, 102d. Having the detection circuit 110 located on the far end from the power supplies enables the distributed hotspot detection grid 106 to monitor the entire PCB 104 for hotspots. Extending the distance between the detection circuit 110 and the power supplies also increases the distance the output of the comparator circuit 110 has to travel across the PCB 104, helping to identify if the board is already damaged, as discussed above.

Figure 2:
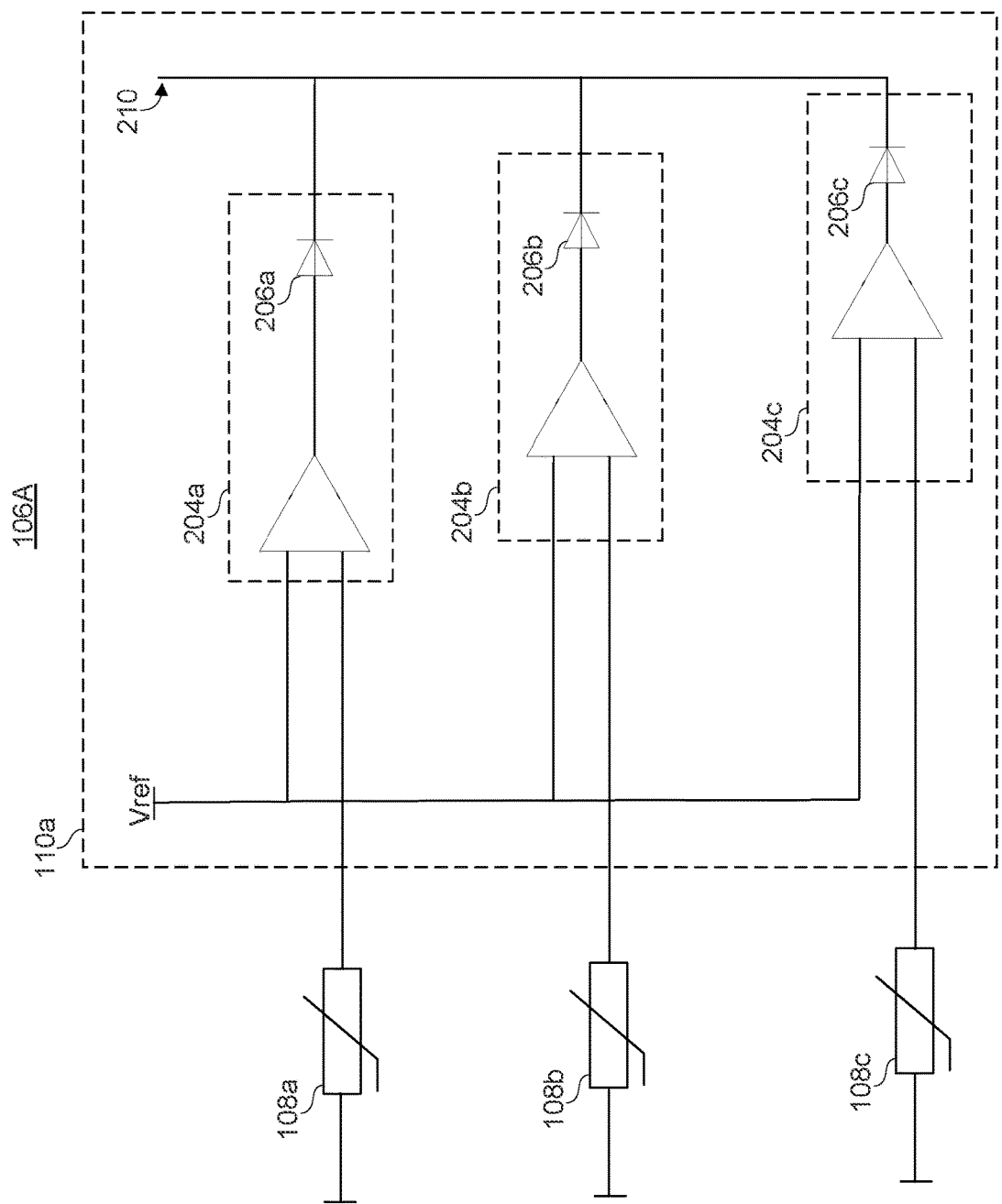
FIG. 2 illustrates an example distributed hotspot detection grid in accordance with embodiments of the technology disclosed herein.

FIG. 2 shows an example distributed hotspot detection grid 106A in accordance with embodiments of the present disclosure. For ease of discussion, the illustration includes only some of the circuit elements that would be included in operation. For example, ground and control signals have been omitted, as well as any noise suppression circuitry (e.g., capacitors) that could be included in various embodiments of the technology. A person of ordinary skill in the art would know how to connect grounds and implement routinely used noise suppression components.

Referring to FIG. 2, the distributed hotspot detection grid 106A includes three passive temperature sensors 108a, 108b, 108c. The symbol used for passive temperature sensors 108a, 108b, 108c in FIG. 2 (and in FIG. 3) is that of an NTC thermistor. Although the illustrated example(s) uses NTC thermistors, various embodiments can use another passive temperature sensor, such as those discussed above with respect to FIG. 1. For purposes of discussing FIGS. 2 and 3, the passive temperature sensors 108a, 108b, 108c, 108d, 108e, 108f can be referred to interchangeably as "NTC thermistor(s)." The number of passive temperature sensors 108a, 108b, 108c has been limited for ease of discussion and the number of passive temperature sensors 108a, 108b, 108c illustrated in FIG. 2 should not be interpreted as limiting the scope of the technology. In various embodiments, a different quantity of passive temperature sensors 102a, 102b, 102c can be included within the distributed hotspot detection grid 106A, depending on the size of the PCB, the resolution desired, the sensitivity of passive temperature sensors 108a, 108b, 108c, and so on.

In this example, each NTC thermistor 108a, 108b, 108c is connected to a corresponding comparator circuit 204a, 204b, 204c. As illustrated, a detection circuit 110a comprises three comparator circuits 204a, 204b, 204c. The voltage level from the NTC thermistors 108a, 108b, 108c serves as an input to the comparator circuit 204a, 204b, 204c of detection circuit 110a, respectively. The detection circuit 110a compares the voltage levels from the NTC thermistors 108a, 108b, 108c against a reference voltage Vref supplied by a power supply. The Vref serves as a threshold voltage against which the voltages from NTC thermistors 108a, 108b, 108c are compared for triggering a change in the output of the comparator circuit 204a, 204b, 204c. When the voltage level from one of the NTC thermistors 108a, 108b, 108c increases (due to the resistance of the NTC thermistor dropping due to a temperature increase) to a voltage level above Vref, its corresponding comparator circuit 204a, 204b, 204c switches its output signal to a different state (e.g., from a LOW to HIGH state or vice versa). Vref can thus be selected as a voltage level equal to the voltage that would be output by NTC thermistors 108a, 108b, 108c should their temperature reach the minimum over-temperature condition to be tolerated by the system design.

The outputs of the comparator circuits 204a, 204b, 204c are connected to a detection circuit output 210. In the illustrated example, a single output 210 is used to signal an over-temperature condition. The signal can be set to generate an alert as to the over-temperature condition and to shut down the power supplies to prevent further damage. The detection circuit output 210 may be connected to the power supplies of the power system, like power supplies 102a, 102b, 102c, 102d discussed with respect to FIG. 1, to send a signal causing the power supplies to shut down. Where all of the comparator circuits are tied to a single output, all of the power supplies can be shut down based on an over-temperature condition being sensed by a single thermistor. In some embodiments, where the comparator circuits are tied to a single output, an indicator component may be included in each comparator circuits 204a, 204b, 204c. The indicator component can be used to identify which of the comparator circuits 204a, 204b, 204c triggered the shut-down signal to be sent to the power supplies. In this way, the location of the temperature increase within the PCB 104 may be more easily pinpointed by identifying the passive temperature sensor 108a, 108b, 108c tied to the triggered comparator circuit. In various embodiments, the indicator component may be a latch. In other embodiments, the indicator component can be a fuse tied to the output of the comparator circuit, designed to trip on an over-temperature condition (i.e., trip at the voltage level output when such a condition is detected). Diodes 206a, 206b, 206c may be included in the comparator circuits 204a, 204b, 204c to ensure that current on the detect circuit output 210 does not flow into the comparator circuits 204a, 204b, 204c.

In some implementations, each of the comparator circuits 204a, 204b, 204c can have its own output connected to shut down a specific one or more of the plurality of power supplies in the power system. For example, a given comparator circuit output can be coupled to the power supply or power supplies that provides power to the traces within the sensing range of the thermistor corresponding to that given comparator circuit. Accordingly, only the power supply or supplies corresponding to the offending short circuit need to be shut down to alleviate the over-temperature condition.

Figure 3:
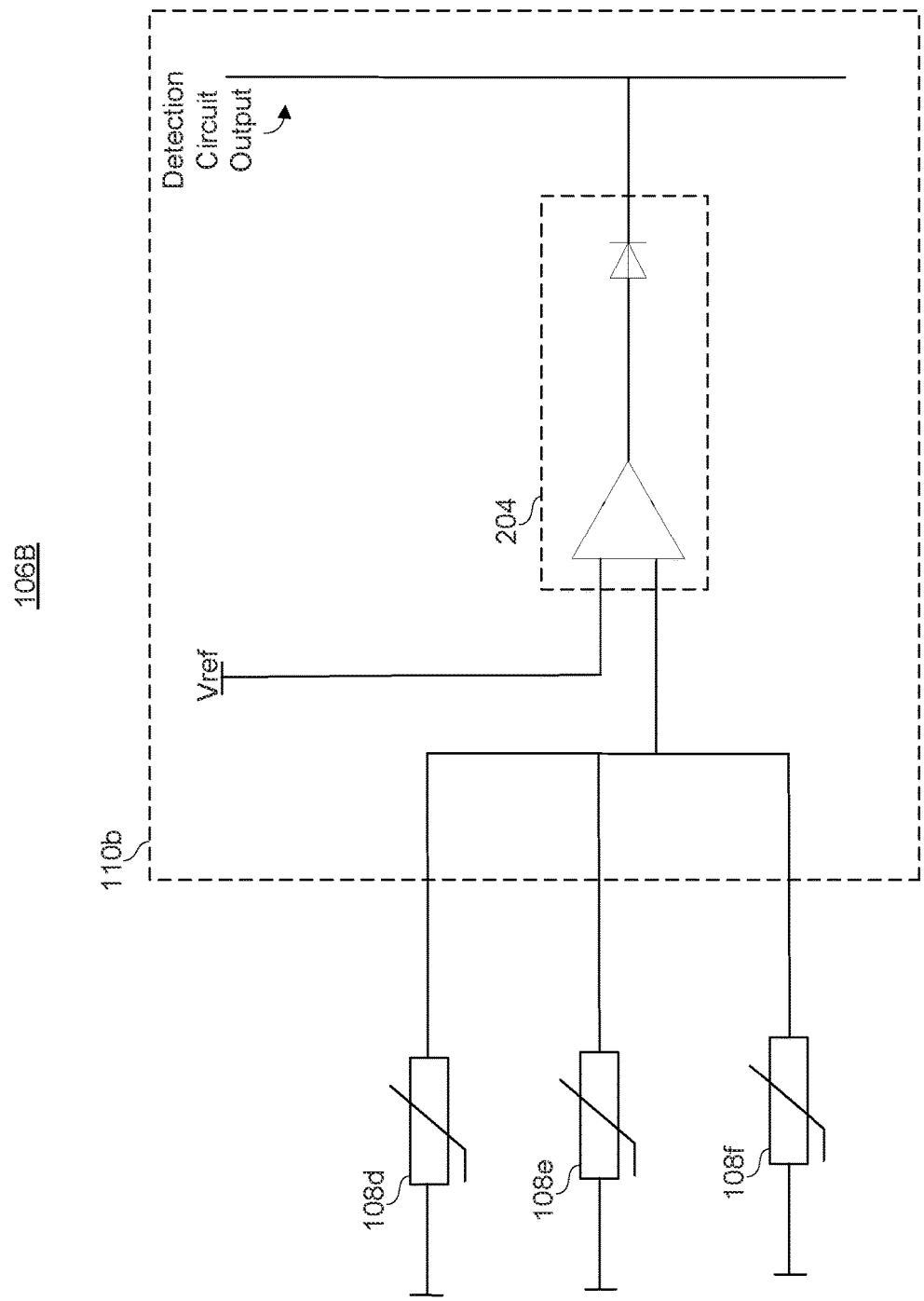
FIG. 3 illustrates another example distributed hotspot detection grid in accordance with embodiments of the technology disclosed herein.

FIG. 3 illustrates another example distributed hotspot detection grid 106B in accordance with embodiments of the present disclosure. As illustrated, multiple NTC thermistors 108d, 108e, 108f are connected in parallel to the same comparator circuit 204 in the detect circuit 110b. In various embodiments, the plurality of NTC thermistors (as discussed with respect to FIG. 1) may all be connected in parallel as illustrated to a single comparator circuit 204. In other embodiments, multiple comparator circuits 204 may be included in the detection circuit 110b, each connected to one or more NTC thermistors connected in parallel. NTC thermistors are used simply as an example; any of the passive temperature sensors discussed with respect to FIG. 1 may be used in a similar manner.

Using a distributed hotspot detection grid 106 as described with respect to FIGS. 1-3 enables effective monitoring for short circuit and temperature issues associated with a power system without impacting the overall design of the system. The grid can be included on a PCB of the power system without increasing the overall footprint, and without unduly impacting the density of the system. The embodiments discussed enable for effective local temperature monitoring of the PCB that is not possible with current active thermal sensing devices in servers. The small size and minimal intrusion of passive temperature sensors (e.g., NTC thermistors) address the unpredictability of thermal issues on the PCB in an effective, reliable, and low cost manner.

Figure 4:
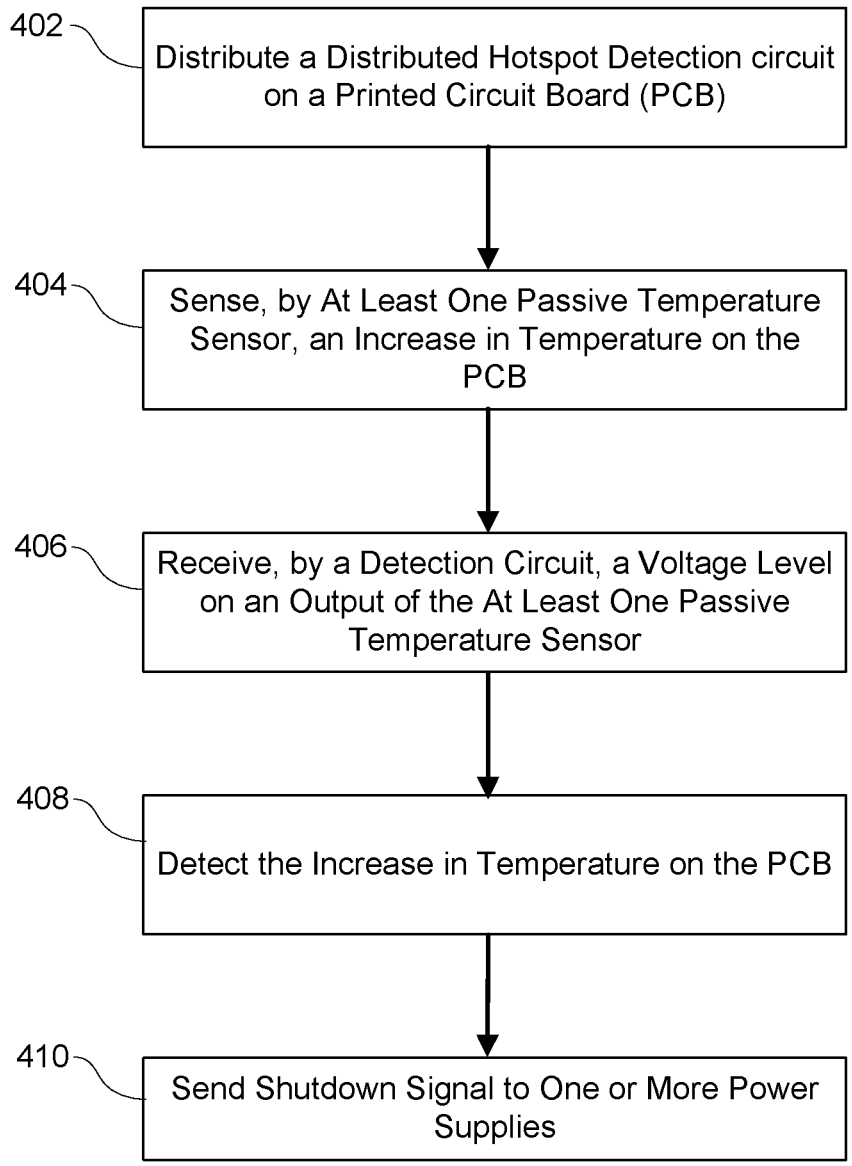
FIG. 4 illustrates an example method for providing power system hotspot protection in a server in accordance with embodiments of the technology disclosed herein.

FIG. 4 illustrates an example method 400 for providing power system hotspot protection in a server in accordance with embodiments of the technology disclosed herein. At operation 402, a distributed hotspot detection grid is distributed on a PCB. The distributed hotspot detection grid may be similar to the distributed hotspot detection grid 106 discussed with respect to FIGS. 1-3, and the discussion above is applicable here. In various embodiments, the distributed hotspot detection grid comprises a plurality of passive temperature sensors and a detection grid. Non-limiting examples of passive temperature sensors include: negative temperature coefficient (NTC) thermistors; resistance temperature detectors (RTDs); positive temperature coefficient (PTD) thermistors; or thermocouples; among other passive temperature sensors.

At 404, an increase in temperature somewhere on a PCB board is sensed by at least one passive temperature sensor distributed on the PCB. When an increase in temperature is sensed, one or more electrical properties of a least one passive temperature sensor distributed on the PCB changes, causing a change in the voltage level across the passive temperature sensor. Accordingly, the voltage level on the output of the passive temperature sensor changes.

At 406, the voltage level on the output of the at least temperature sensor is received by a detection circuit. In various embodiments, the detection circuit is similar to the detection circuit 110 discussed with respect to FIGS. 1-3. The detection circuit is connected with the output of the plurality of passive temperature sensors, such that the output of the at least one passive temperature sensor serves as an input to a comparator circuit of the detection circuit.

At 408, the detection circuit detects the increase in temperature on the PCB. A comparator circuit of the detection circuit, connected to the passive temperature sensor by an electrical trace on the PCB, registers the change in the voltage level and compares it against a threshold value. In various embodiments, the threshold value may be a reference voltage Vref. If it does not exceed a threshold value, the comparator circuit does not change. If the voltage level does exceed the threshold value, the comparator circuit changes its state (similar to the change discussed with respect to FIGS. 2-3), and the change in state makes the detection circuit output a shut down signal to one or more power supplies of the power system at operation 410. In various embodiments, the signal from the detection circuit may trigger a latching device located within the power supplies, while in other embodiments the latching device may be on the PCB of the power system.

Figure 5:
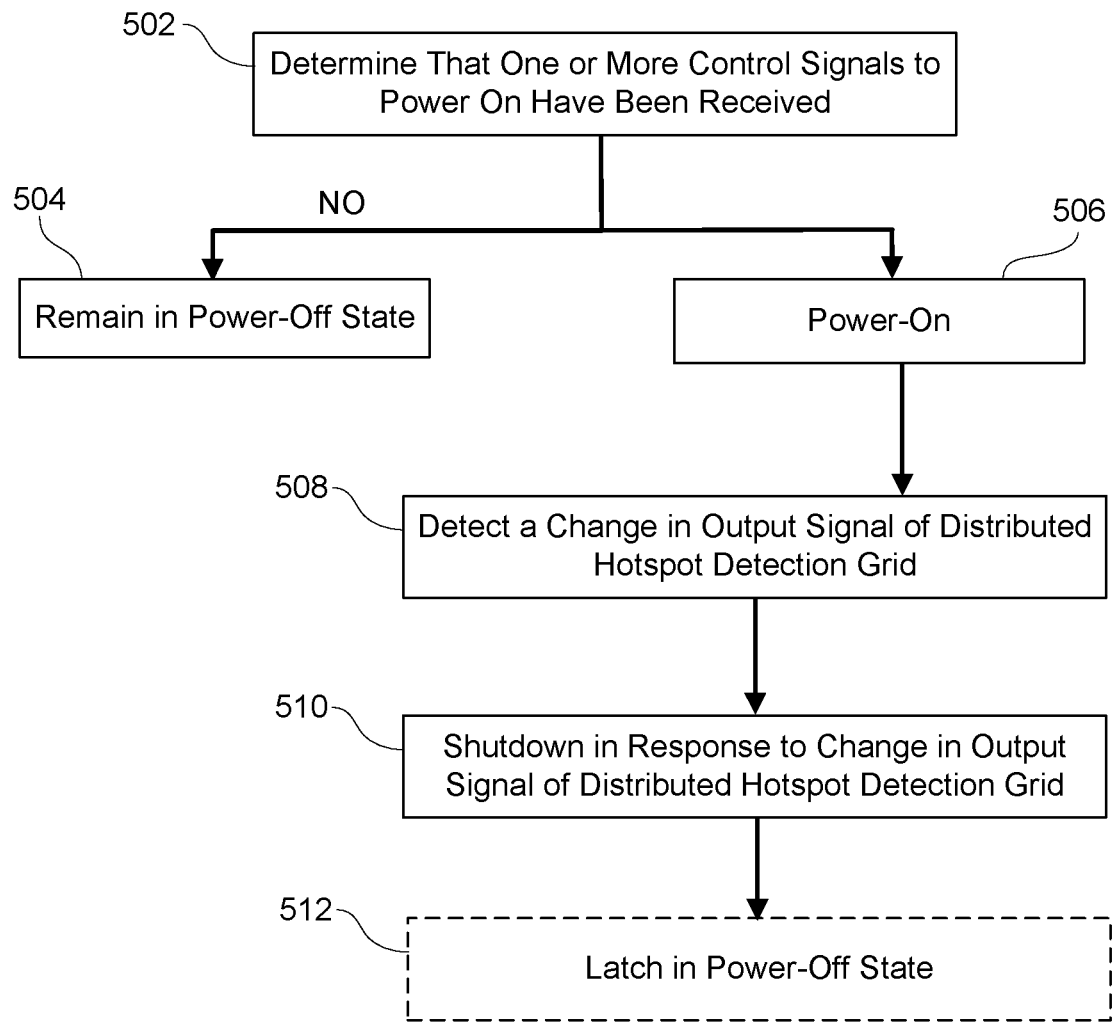
FIG. 5 illustrates an example method for operating a power system with a distributed hotspot detection grid in accordance with embodiments of the technology disclosed herein.

FIG. 5 illustrates an example method 500 for operating a power system with a distributed hotspot detection grid in accordance with embodiments of the present disclosure. At operation 502, the power supply checks whether it has received one or more control signals necessary to power on. In various embodiments, the necessary control signals may include the operational signals of the power supply discussed above with respect to FIGS. 1-4, such as the enable signal. In various embodiments, the baseline output signal from the distributed hotspot detection grid may be included as a necessary signal for the power supplies to power on, as discussed with respect to FIG. 1. If all signals have not been received, at operation 504, the power supplies remain in a power-off state. In various embodiments, the signal from the distributed hotspot detection grid may not be received due to damage to the PCB that occurred earlier, either during manufacture of the PCB itself or the power system assembly. If all signal have been received, the power supplies will power on at operation 506 and begin to provide power to the power system for distribution to sub-assemblies and other server components.

At operation 506, one or more of the power supplies detect a change in the output signal from the distributed hotspot detection grid. The distributed hotspot detection grid may be similar to the distributed hotspot detection grid discussed with respect to FIGS. 1-3. In various embodiments, the change in the output signal may be based on a change in the electrical properties of at least one passive temperature sensor. For example, where the passive temperature sensors of the distributed hotspot detection grid include one or more NTC thermistors, the change in output signal may indicate that one or more of the NTC thermistors detected a temperature increase indicative of a short circuit or hotspot. In other embodiments, the change in the output signal may occur due to undetected damage that occurred which has impacted or severed the connection between the distributed hotspot detection grid and the one or more power supplies. Either way, the change in signal is recognized as a shut down signal by the one or more power supplies. In response to the change in the output signal of the distributed hotspot detection grid, the power supplies shut down at operation 510. In some embodiments, the change in output signal may be detected by an overcurrent protection device of the power supply to which the output signal from the distributed hotspot detection grid is connected. In various embodiments, the change in output signal may be detected by an SRC device in the power supply to which the output signal from the distributed hotspot detection grid is connected. In some embodiments, a latching device may be included in the power supplies, and the one or more power supplies may latch in the power-off state at operation 512. The power supplies would stay powered-off in such embodiments until being disconnected from the external power source, thereby resetting the latching device.

In common usage, the term "or" can have an inclusive sense or exclusive sense. As used herein, the term "or" should always be construed in the inclusive sense unless the exclusive sense is specifically indicated or logically necessary. The exclusive sense of "or" is specifically indicated when, for example, the term "or" is paired with the term "either", as in "either A or B." As another example, the exclusive sense may also be specifically indicated by appending "exclusive" or "but not both" after the list of items, as in "A or B, exclusive" and "A or B but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A printed circuit board, comprising:
a plurality of electrical traces for distributing power within a power system; and
a distributed hotspot detection grid comprising a plurality of passive temperature sensors and a detection circuit that is configured to monitor signals output by the passive temperature sensors;
wherein the distributed hotspot detection grid is configured to send a shut down signal to one or more power supplies of the power system if the detection circuit detects a temperature increase; and
a kill switch device, the kill switch device configured to receive the shut down signal from the distributed hotspot detection grid and, in response, turn off the one or more power supplies.

2. The printed circuit board of claim 1, wherein the plurality of passive temperature sensors includes one or more of: negative temperature coefficient (NTC) thermistors; resistance temperature detectors (RTDs); positive temperature coefficient (PTD) thermistors; thermocouples.

3. The printed circuit board of claim 2, wherein an output of the distributed hotspot detection grid is configured such that a baseline signal of the output of the distributed hotspot detection grid is equal to a signal necessary for the one or more power supplies to operate.

4. The printed circuit board of claim 3, wherein the output of the distributed hotspot detection grid is tied into one or more electrical traces containing one or more signals necessary for the one or more power supplies to operate.

5. The printed circuit board of claim 1, wherein the plurality of electrical traces are connected to the one or more power supplies of the power system through an interface.

6. The printed circuit board of claim 1, wherein the plurality of passive temperature sensors comprises a plurality of negative temperature coefficient (NTC) thermistors.

7. The printed circuit board of claim 6, wherein the detection circuit comprises a plurality of comparator circuits.

8. The printed circuit board of claim 7, wherein there is a 1-to-1 correspondence between the plurality of comparator circuits and the plurality of NTC thermistors, such that each NTC thermistor is connected to a respective comparator circuit of the detection circuit.

9. The printed circuit board of claim 7, wherein a subset of NTC thermistors of the plurality of NTC thermistors is connected to a different comparator circuit of the plurality of comparator circuits, the subset comprises one or more NTC thermistors.

10. The printed circuit board of claim 1, wherein the one or more power supplies include a latching device configured to latch each of the respective power supply in a power off state after receipt of the shut down signal from the distributed hotspot detection grid.

11. The printed circuit board of claim 1, wherein the detection circuit is displaced on a distal end of the printed circuit board opposite an interface for one or more power supplies.

12. The printed circuit board of claim 1, wherein the detection circuit includes a plurality of output signals, each output signal configured to send the shut down signal to one of the one or more power supplies of the power system.

13. A method, comprising:
distributing a plurality of passive temperature sensors and a detection circuit on a printed circuit board, the detection circuit connected to an output of each of the plurality of passive temperature sensors;
sensing, by at least one passive temperature sensor of the plurality of passive temperature sensors, an increase in temperature on the printed circuit board;
receiving, by a detection circuit, a voltage level on an output of the at least one passive temperature sensor;
detecting, by the detection circuit, the increase in temperature on the printed circuit board; and
sending, by the detection circuit, a shut down signal to a kill switch device on the printed circuit board, the kill switch device configured to turn off the one or more power supplies when triggered.

14. The method of claim 13, wherein the at least one passive temperature sensor distributed on a printed circuit board is one of: a negative temperature coefficient (NTC) thermistor; a resistance temperature detector (RTD); a positive temperature coefficient (PTD) thermistor; a thermocouple.

15. The method of claim 13, wherein detecting the increase in temperature comprises comparing, by at least one comparator circuit of the detection circuit, the voltage level from the at least one passive temperature sensor to a threshold value.

16. The method of claim 13, wherein the plurality of passive temperature sensors comprises a plurality of negative temperature coefficient (NTC) thermistors, and wherein the detection circuit comprises a plurality of comparator circuits.

17. A method, comprising:
  distributing a plurality of passive temperature sensors and a detection circuit on a printed circuit board, the detection circuit connected to an output of each of the plurality of passive temperature sensors;
  sensing, by at least one passive temperature sensor of the plurality of passive temperature sensors, an increase in temperature on the printed circuit board;
  receiving, by a detection circuit, a voltage level on an output of the at least one passive temperature sensor;
  detecting, by the detection circuit, the increase in temperature on the printed circuit board; and
  sending, by the detection circuit, a shut down signal comprising sending the shut down signal to a kill switch device in each of the one or more power supplies, the kill switch device configured to turn off the respective one of the one or more power supplies.

18. The method of claim 17, wherein the at least one passive temperature sensor distributed on a printed circuit board is one of: a negative temperature coefficient (NTC) thermistor; a resistance temperature detector (RTD); a positive temperature coefficient (PTD) thermistor; a thermocouple.

19. The method of claim 17, wherein the plurality of passive temperature sensors comprises a plurality of negative temperature coefficient (NTC) thermistors, and wherein the detection circuit comprises a plurality of comparator circuits.

20. The method of claim 17, wherein detecting the increase in temperature comprises comparing, by at least one comparator circuit of the detection circuit, the voltage level from the at least one passive temperature sensor to a threshold value.

* * * * *